United States Patent [19]
Holst

[11] Patent Number: 5,790,461
[45] Date of Patent: Aug. 4, 1998

[54] REGISTER FILE WITH BYPASS CAPABILITY

[75] Inventor: John C. Holst, San Jose, Calif.

[73] Assignee: Intergraph Corporation, Huntsville, Ala.

[21] Appl. No.: 905,034

[22] Filed: Aug. 1, 1997

Related U.S. Application Data

[63] Continuation of Ser. No. 372,278, Jan. 12, 1995, abandoned.

[51] Int. Cl.$^6$ .................................................. G11C 7/00
[52] U.S. Cl. ............... 365/189.04; 365/154; 365/230.05
[58] Field of Search ........................... 365/189.04, 154, 365/230.05, 156

[56] References Cited

U.S. PATENT DOCUMENTS 4,802,122  1/1989  Auvinen et al. ......................... 365/154

Primary Examiner—Huan Hoang
Attorney, Agent, or Firm—Townsend and Townsend and Crew LLP

[57] ABSTRACT

Control circuitry for a register file is provided which allows immediate or rapid output of input write data by bypassing the need to store the data and then read it out of the register file. In each pairing of memory cells, the read line is coupled to both the storage cell and to the write line. The connection to the write line is configured so that, when the connection is activated, such as by turning on a transistor, the magnitude of the data signal provided from the write line to the read line is large enough to overpower whatever signal is being output to the read line from the memory cell. In this way, when the connection from the write line to the read line is activated, the write line will output the information on the read line, rather than the information in the storage cell. The information on the read line can then be output onto the write line without the information first being stored in the memory cell. This is advantageous when the write data is available at a time when its validity is unknown. Preferably, the device is further configured to permit writing of the data from the write line into the memory cell once the validity of the data is ascertained, e.g., under control of a word line.

20 Claims, 2 Drawing Sheets

REGISTER FILE WITH BYPASS CAPABILITY

This is a Continuation of application Ser. No. 08/372,278, filed Jan. 12, 1995, now abandoned.

The present invention relates to register file circuitry for use in a computer and in particular to a register file having a capability for bypassing a register file to avoid delay in the data path.

BACKGROUND OF THE INVENTION

The use of a plurality of registers organized into a "register file" is well known in the art. As depicted in FIG. 1, a register file 10 includes, typically, a number of registers 12a–12h, 14a–14h which may be organized into banks 16a, 16b, each register having a plurality of cells 18a–18h each storing one bit of data. As is well known, a register file may have a larger or smaller number of registers, banks or bits per register than that depicted in FIG. 1. Control circuitry, typically found in today's computer systems, may be used to store data in and to read data from the register file. This is typically done by providing the write data on a first line or bus 20, a register address (or other identifier of a register) on an address line or bus 22, and control signals (e.g., to enable writing) on a control line or bus 24. Those of skill in the art will recognize a number of register file configurations. For example, different storage circuitry or memory cell configurations may be used. Further, a number of configurations may be used to implement connections between cells, between registers, and between banks of registers.

Accordingly, a detailed description of the various implementations and register files will not be provided for the general case. However, it will be noted that one implementation, known to those of skill in the art, includes providing the following for each cell: a write bit (WR) and inverted write bit ($\overline{\text{WR}}$) input line; read bit (RD) and inverted read bit ($\overline{\text{RD}}$) output lines; multiple-cell write word lines and read word lines; and read and write address information.

It is not uncommon, during normal computer operations, to require that data be written into a register and also to require the use of the same data in a subsequent operation. In one previous configuration, this need was accommodated by writing the data into a register file in the normal fashion and then performing a read operation to read the data which was just written into the register file for use in the subsequent operation. This configuration, however, may cause an undesirable amount of delay because of the time needed to both write the data into the register file and to then subsequently read the data out of the register file.

Accordingly, another previous approach included a dual-path bypass, such as the one depicted in FIG. 1. In this approach, the write data followed two separate paths: a first path 20, providing the data to the register file; and a second path 28 which bypassed the register file. The bypass path 28 provided one input to a multiplexer 30, controlled by a control signal 32 (e.g., a control signal output by a processor). The second multiplexer input was provided from the read data line or bus 32 representing the normal output path for data read from the register file. The multiplexer provides an output 34 which, depending on the state of the control signal 32, is either the signal on the read data line or the signal on the write data line 28. In this fashion it is possible to provide read data to the register file 10 and, simultaneously, output the same data on line 34 without having to wait for that data to be written into the register file.

The configuration depicted in FIG. 1 is satisfactory in many circumstances. However, it requires the provision of multiplexer 30 and control signal 32 as well as some amount of delay in connection with the multiplexer 30.

Accordingly, it would be advantageous to provide means for effectively performing a register file bypass (i.e., outputting write data without having to wait for the write operation) which does not have the disadvantage of requiring additional circuitry such as a multiplexer 30 and control signal 32.

SUMMARY OF THE INVENTION

The present invention provides a register file configuration which achieves the effect of a bypass without requiring a multiplexer and which outputs the write data with reduced or no additional delay.

In one embodiment, the write data is coupled onto the read data line so that only a single output line (the read data line) is needed. There is no need for additional control circuitry such as a multiplexer. In some cases, the write data is placed onto the write line, and thus onto the read line, "early" (i.e., before it is consistently verified that the write data is valid). Thus, this configuration provides the advantage that the early write data can be immediately output on the read data line. However, to avoid the possibility of writing invalid data into the register file, which could potentially overwriting valid data, the present invention provides circuitry for transferring the data onto the read line while avoiding writing of the data into the memory, at least until the validity of the write data is verified.

DESCRIPTION OF THE PREFERRED EMBODIMENT

Figure 1:
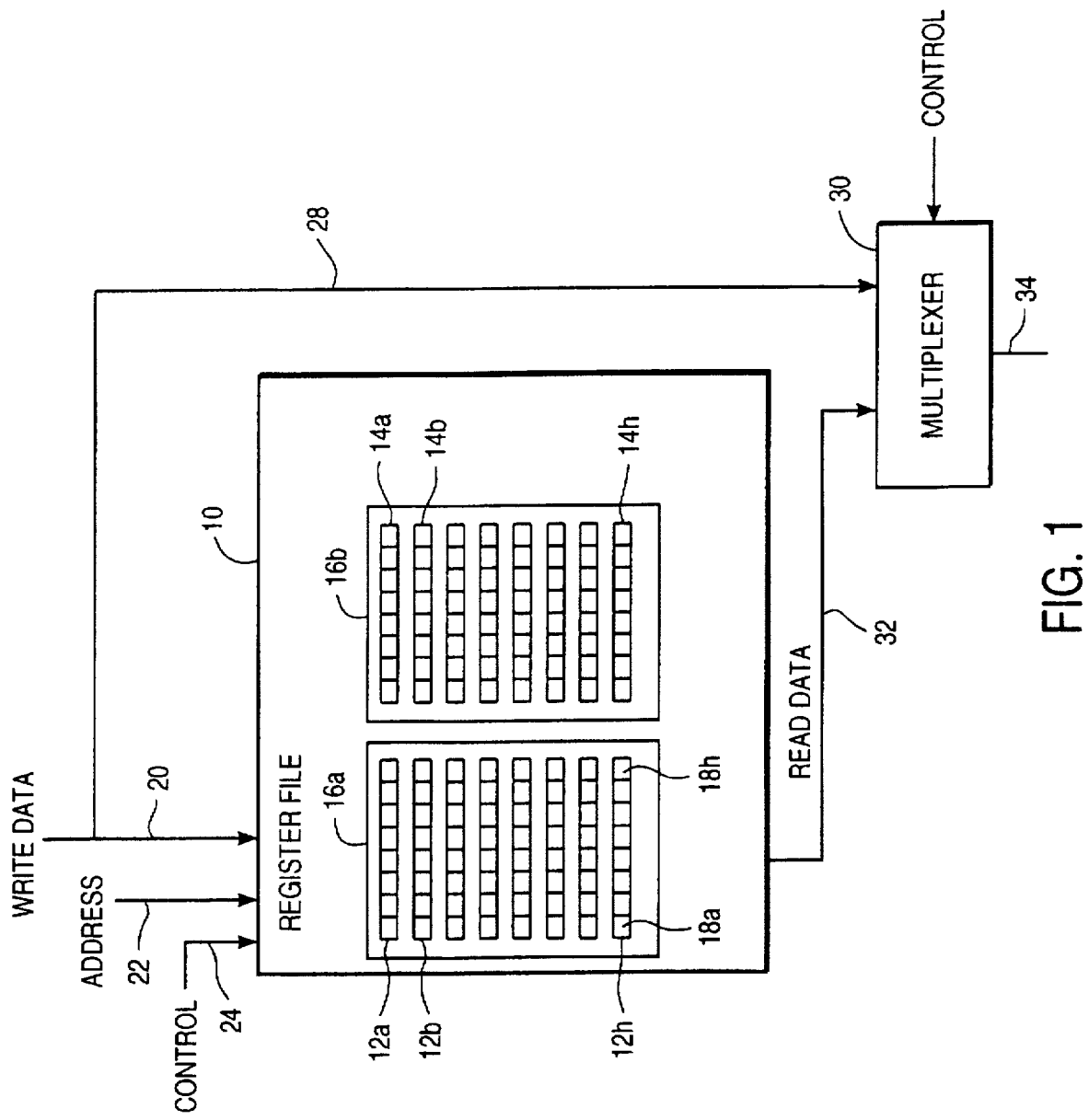
FIG. 1 shows a register file coupled to a multiplexer according to previous devices.
Figure 2:
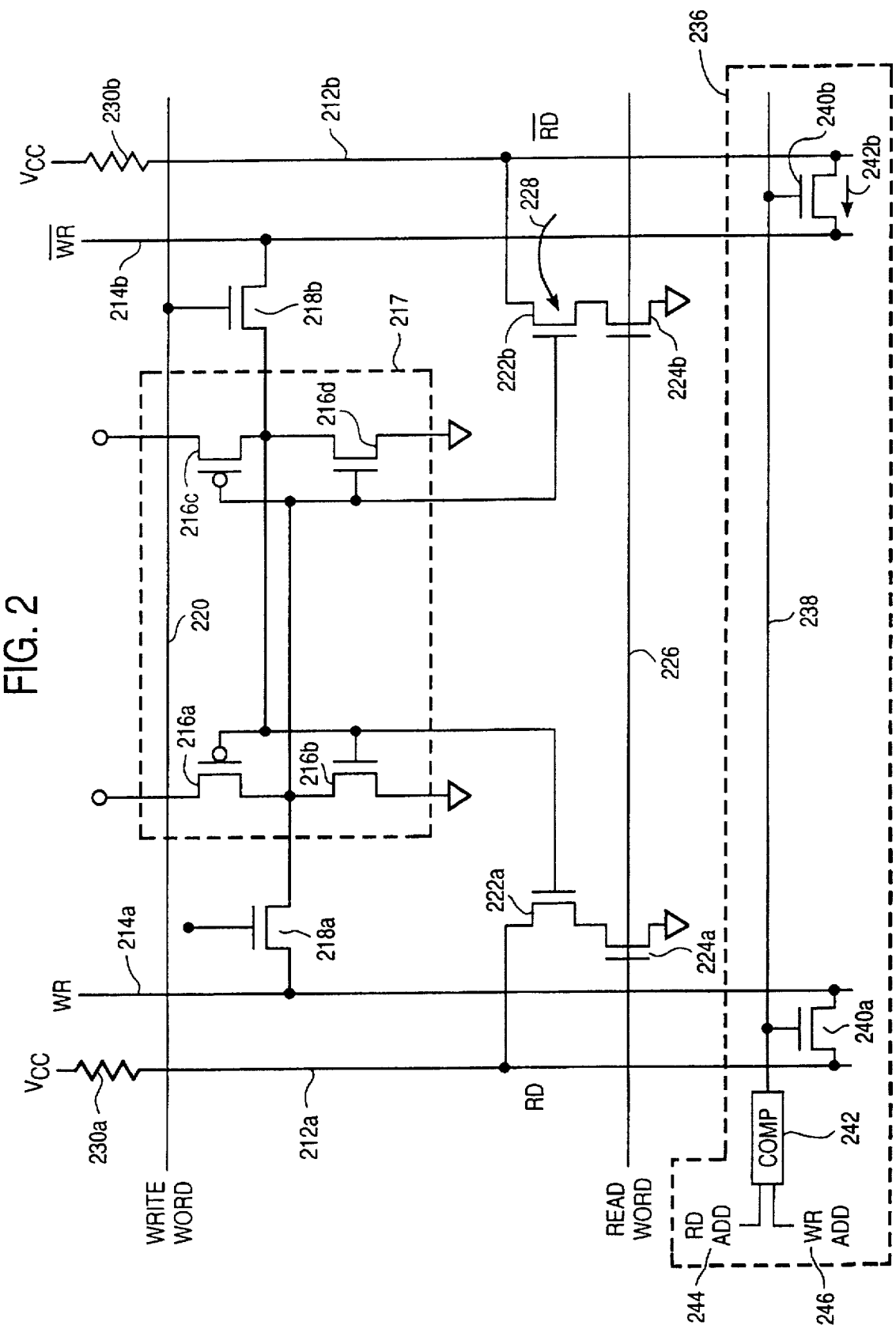
FIG. 2 shows circuitry associated with a single cell of a register file, according to an embodiment of the present invention.

FIG. 2 depicts circuitry that can be used in connection with the present invention for a register file which can achieve the effect of bypass of the register file. For convenience, only a single cell 18a of a register file is shown. Those skilled in the art will recognize that a typical register file will have many storage locations. For example, in a configuration having N by M addressable locations, the circuitry shown in FIG. 2 will need to be increased to accommodate N by M cells. In the embodiment of FIG. 2, RD and $\overline{\text{RD}}$ lines 212a, 212b are precharged to, e.g., $V_{cc}$. In a typical write operation, the WR line 214a will be precharged to $V_{cc}$ while the $\overline{\text{WR}}$ line is driven to ground. Write lines 214a, 214b WR, $\overline{\text{WR}}$ are coupled to the storage transistors 216a, 216b, 216c, 216d via transistors 218a, 218b controlled from the word line 220, in conventional fashion. The RD and $\overline{\text{RD}}$ lines 212a, 212b are controllably couplable to ground via transistors 222a, 222b, controlled by the storage cell 217 and transistors 224a, 224b, controlled by the read word line 226.

In a typical read operation, there will be an amount of current flowing 228 from the RD or $\overline{\text{RD}}$ lines to ground on one side or the other. This current 228, multiplied by the resistance 230a, 230b yields a voltage. In a typical read operation, the voltage over the resistance on one side (e.g., 230a, depending on the binary state of the memory cell 217)

will be about $V_{cc}$. The voltage on the other side (e.g., 230b) will be smaller by an amount denoted ΔV. The value of ΔV must be large enough to provide sufficient "margin" between the two sides of the cell for the sense amp to detect the difference. Those skilled in the art will recognize that it is desirable to have the smallest ΔV which still complies with the necessary design margin. This allows the minimum possible response time. That is, as ΔV becomes larger, the recovery time (and thus the time between valid senses) will increase. In one embodiment, ΔV is approximately 200 mV. In the depicted embodiment, it is desired to avoid writing data into the cell (i.e., potentially changing the state of cell 217) until after the write data, which may have arrived early, has been verified to be valid. In this sense, the embodiment achieves early bypass (i.e., output of the write data even when the write data is received early, i.e., before verifying the validity of the data) but later writing into the register (i.e., writing only after validity of the data has been assured).

One manner of avoiding overwriting valid data with incoming data whose validity is unknown is to use the write word line 220. In this way, the write word line will be controlled to remain in an inactive state (turning off transistors 240a, 218b) until such time as the validity of the write data has been assured. This solves the problem of avoiding writing potentially invalid data, but it is still necessary to provide a path for the write data onto the read line, i.e., to achieve the bypass function.

According to the embodiment depicted in FIG. 2, this can be achieved by using circuitry 236. Circuitry 236 involves providing an extra line 238 for controlling first and second extra transistors 240a, 240b. The extra transistors 240a, 240b selectively couple the write lines 214a, 214b to the read lines 212a, 212b, respectively. Extra transistors 240a, 240b have thresholds such that ΔV is small related to the threshold voltages of the transistors 240a, 240b. In this way, the extra transistors 240a, 240b will not be conductive or be affected by ΔV on the bit lines 214a, 214b, such as, for example, the case where the write bit lines (WR and $\overline{WR}$) are both active (or high) and line 238 is also active, or high. This allows the embodiment of FIG. 2 to perform a read without a bypass, if required, in such a state. The transistors 240a, 240b are configured such that if the transistors are on, they will pull the lines down by 2ΔV or more. In other words, if transistor 240b is turned on, the current 242b from the $\overline{RD}$ line 212b to the $\overline{WR}$ line 214b will drive the $\overline{RD}$ to $V_{cc}$−2Δv (or less). The extra transistors 240a, 240b are each sufficient to override what the storage cell 217 is trying to drive onto the read bit lines 212a, 212b. In this way, by controlling the extra line 238 (in order to control the extra transistors 240a, 240b) the data on the write line can be transferred directly onto the read bit line but without writing data into or otherwise affecting the state of the storage cell 217.

In the depicted embodiment, the extra line 238 is controlled by an address comparator 242. The comparator 242 compares the read address 244 with the write address 246. When the read address and write address 244, 246 are identical, the comparator 242 drives the extra line 238 to an active or high state. The transistors 240a, 240b then cause the write data to overpower what the memory cell 217 is outputting onto the read line 212a, 212b.

In a typical situation, the read address will be an address which is output by control circuitry of a computer, for example. The write address will be an address which is also output by, e.g., control circuitry of a computer. By waiting until the read address and write address are identical before transferring the write data onto the read lines, the embodiment of FIG. 2 is able to ensure when a bypass is needed.

In light of the above description, a number of advantages of the present invention can be seen. The present invention achieves the function of a register bypass (i.e., avoiding delay in outputting the write data) without having to provide a separate multiplexer or a control signal for the multiplexer. The present invention takes advantage of early arrival of the write data (arrival before validity of the data is known) while avoiding the potential for overwriting stored data with potentially invalid data.

A number of variations and modifications of the invention can also be used. The invention can be used in connection with register files of any size or composition, and is not restricted to register files of the size depicted. The present invention can be used in connection with memory devices other than register files, such as a cache memory system.

Although the present invention has been described by way of a preferred embodiment and certain variations and modifications, other variations and modifications can also be used, the invention being defined by the following claims.

What is claimed is:

1. An apparatus for outputting write data from a memory cell in a computer, said memory cell including a write bit line for inputting said write data, a storage cell coupled to said write bit line for storing said write data, and a read bit line coupled to said storage cell for outputting data, the apparatus comprising:

a controllable switch for coupling said write bit line to said read bit line before said storage cell stores said write data, wherein, when said switch is controlled to be in a first state, a state of said read bit line is controlled by a state of said storage cell, and when said switch is controlled to be in a second state, the state of said read bit line is controlled by a state of said write bit line and is independent of the state of said storage cell.

2. The apparatus as claimed in claim 1, wherein said controllable switch is a transistor.

3. The apparatus as claimed in claim 1 further comprising:

a comparator for receiving a read address and a write address and for controlling said controllable switch to be in said second state when said read address corresponds to said write address.

4. The apparatus of claim 3 wherein the comparator also is for controlling said controllable switch to be in said first state when said read address and said write address are dissimilar.

5. The apparatus as claimed in claim 1 wherein the memory cell also includes a write word line for asserting a write signal, and said storage cell stores said write data in response to said write signal, and wherein said write address appears on said write bit line before said write signal appears on said write word line.

6. The apparatus as claimed in claim 5 wherein said write signal appears on said write word line when the write data is valid.

7. An apparatus for outputting write data from a memory cell in a computer, said memory cell including a write bit line for inputting said write data, a storage cell coupled to said write bit line for storing data, and a read bit line coupled to said storage cell for outputting data stored in said storage cell, the apparatus comprising:

a controllable switch, coupling said write bit line to said read bit line wherein, when said switch is controlled to be in a first state, a state of said read bit line is controlled by a state of said storage cell, when said switch is controlled to be in a second state, the state of said read bit line is controlled by a state of said write bit line and is independent of the state of said storage cell; and a sense amplifier coupled to said read bit line, said sense amplifier configured to distinguish between a first read bit line state and a second read bit line state, the first read bit line state and the second read bit line state differing by at least a first margin voltage, wherein a first voltage is on said read bit line when said write bit line is in a first state, and a second voltage is on said read bit line when said write bit line is in a second state, and wherein the first voltage and the second voltage differ by at least twice said first margin voltage.

8. The apparatus of claim 7 further comprising:

a comparator for receiving a read address and a write address and for controlling said controllable switch to be in said second state when said read address corresponds to said write address.

9. The apparatus as claimed in claim 8 wherein said comparator is also for controlling said controllable switch to be in said first state when said read address and said write address are different.

10. The apparatus as claimed in claim 7 wherein the memory cell also includes a write word line for asserting a write signal, and said storage cell stores said write data in response to said write signal, and wherein said write address appears on said write bit line before said write signal appears on said write word line.

11. The apparatus as claimed in claim 10 wherein said write signal appears on said write word line when the write data is valid.

12. An apparatus for outputting write data from a memory cell in a computer, said memory cell including a write bit line having a state for inputting said write data, a storage cell coupled to said write bit line having a state for storing said write data, and a read bit line coupled to said storage cell and having a state for outputting data, the apparatus comprising:

means having a first state and a second state for coupling said write bit line to said read bit line wherein,
when said means for coupling is in the first state, the state of said read bit line is controlled by the state of said storage cell, and
when said means for coupling is in a second state, the state of said read bit line is controlled by the state of said write bit line and is substantially independent of the state of said storage cell; and means for receiving a read address and a write address and for controlling said means for coupling to be in said first state when said read address corresponds to said write address.

13. The apparatus of claim 12 wherein the means for receiving includes means for comparing said read address and said write address.

14. The apparatus of claim 12 wherein the means for receiving a read address and a write address is also for controlling said means for coupling to be in said second state when said read address and said write address are different.

15. A method for outputting write data from a memory cell in a computer, said memory cell including a write bit line for inputting said write data, a storage cell, coupled to said write bit line, for storing data, and a read bit line, coupled to said storage cell for outputting data stored in said storage cell, the method comprising the steps of:

coupling said write bit line to said read bit line with a controllable switch before said storage cell stores said write data;

controlling said controllable switch to be in a first state, wherein the state of said read bit line is controlled by the state of said storage cell, and is independent of the state of said write bit line, and;

controlling said controllable switch to be in a second state, wherein the state of said read bit line is controlled by the state of said write bit line and is independent of the state of said storage cell, without writing said write data into said storage cell.

16. The method of claim 15 further comprising the step of:

distinguishing between a first read bit line state and a second read bit line state, the first read bit line state and the second read bit line state differing by at least a first margin voltage, wherein a first voltage is on said read bit line when said write bit line is in a first state, and a second voltage is on said read bit line when said write bit line is in a second state; and wherein the first voltage and the second voltage differ by at least twice said first margin voltage.

17. The method of claim 15 comprising the step of:

distinguishing between a first read bit line state and a second read bit line state, the first read bit line state and the second read bit line state differing by at least a first margin voltage, wherein a first voltage is on said read bit line when said write bit line is in a first state, and a second voltage is on said read bit line when said write bit line is in a second state, and wherein the first voltage and the second voltage are different.

18. The method of claim 15 further comprising the step of:

subsequent to the step of controlling said controllable switch to be in a first state, writing said write data into said storage cell.

19. The method of claim 15, wherein said memory cell receives a read address and a write address, the method further comprising the steps of:

comparing said read address and said write address; and controlling said controllable switch to be in said second state when said read address corresponds to said write address.

20. The method of claim 19 further comprising the step of controlling said controllable switch to be in said first state when said read address and said write address are different.

* * * * *